(12) United States Patent
Tareeva et al.

(10) Patent No.: US 11,048,009 B2
(45) Date of Patent: Jun. 29, 2021

(54) PROGRAMMABLE UNIVERSAL PROBE

(71) Applicant: Elena A. Tareeva, Ulyanovsk (RU)

(72) Inventors: Elena A. Tareeva, Ulyanovsk (RU); Dmitry A. Gurman, s. Krasny Yar Ulyanovskaya obl. (RU); Aleksey A. Lankov, Ulyanovsk (RU)

(73) Assignee: Elena A. Tareeva, Ulyanovsk (RU)

( * ) Notice: Subject to any disclaimer, the term of this patent is extended or adjusted under 35 U.S.C. 154(b) by 0 days.

(21) Appl. No.: 17/159,459

(22) Filed: Jan. 27, 2021

(65) Prior Publication Data

US 2021/0149071 A1 May 20, 2021

Related U.S. Application Data

(63) Continuation of application No. PCT/RU2019/000716, filed on Oct. 8, 2019.

(30) Foreign Application Priority Data

Oct. 26, 2018 (RU) .......................... RU2018137733

(51) Int. Cl.
*G01V 3/08* (2006.01)
*G01V 3/10* (2006.01)
(Continued)

(52) U.S. Cl.
CPC ............ *G01V 3/081* (2013.01); *E21B 43/126* (2013.01); *G01R 1/06788* (2013.01); *G01V 3/08* (2013.01);
(Continued)

(58) Field of Classification Search
CPC . G01V 3/15; G01V 3/104; G01V 3/08; G01V 3/10; G01V 3/107; G01V 3/12;
(Continued)

(56) References Cited

U.S. PATENT DOCUMENTS 5,337,002 A 8/1994 Mercer
6,606,032 B1 8/2003 Fling
(Continued)

FOREIGN PATENT DOCUMENTS

RU 121600 U1 10/2012
RU 2549944 C1 5/2015
(Continued)

OTHER PUBLICATIONS

International Search Report from PCT/RU2019/000716, filed Oct. 8, 2019, dated Jan. 16, 2020.
FXL 12 extended-range grey depth probe for DigiTrak F2 or F5 locations (12 kHz), http://grab-electronics.ru/oborudovanie-gnb/sonde-digitrak-f2-f5/fxl12/.
Falcon F5 Systems, Digital Control Inc., https://digital-control.com/receivers/digitrak-falcon-f5-1.
SNS Systems, http://sense-hdd.ru.

*Primary Examiner* — Raul J Rios Russo
(74) *Attorney, Agent, or Firm* — Patentbar International, P.C.

(57) ABSTRACT

A programmable universal probe comprises a housing having a controllable electrical power source installed therein to provide the assemblies of the probe with a supply voltage, a controller which includes a system of accelerometer sensors, a microcontroller and a temperature sensor, an antenna assembly in the form of a ferrite transmitting antenna, and a radiated power meter, consisting of a current sensor with an amplifier. The antenna assembly is equipped with power switches and an input signal amplifier. The ferrite antenna is designed as a transceiver antenna which is capable of receiving the operating parameters of the probe in a programming mode and transmitting information to a receiver in an operating mode. The receiver and the programmable probe have a compatible data reception and transmission protocol.

1 Claim, 1 Drawing Sheet

(51) Int. Cl.
  G01R 1/067 (2006.01)
  E21B 43/12 (2006.01)
  G01V 3/15 (2006.01)
  G01V 3/165 (2006.01)
  G01V 3/12 (2006.01)

(52) U.S. Cl.
  CPC ............... G01V 3/10 (2013.01); G01V 3/104 (2013.01); G01V 3/15 (2013.01); G01V 3/165 (2013.01); G01V 3/107 (2013.01); G01V 3/12 (2013.01)

(58) Field of Classification Search
  CPC ...... G01V 3/081; G01V 3/165; E21B 43/126; G01R 1/06788
  USPC .......... 324/67, 323, 326, 329, 330, 334, 376
  See application file for complete search history.

(56) References Cited

U.S. PATENT DOCUMENTS

| 2014/0247152 A1* | 9/2014 | Proud | H02J 50/12 340/870.07 |
| 2014/0249825 A1* | 9/2014 | Proud | H02J 50/80 704/275 |
| 2019/0154439 A1* | 5/2019 | Binder | G01S 15/08 |

FOREIGN PATENT DOCUMENTS

| RU | 163669 U1 | 7/2016 |
| RU | 173105 U1 | 8/2017 |

* cited by examiner

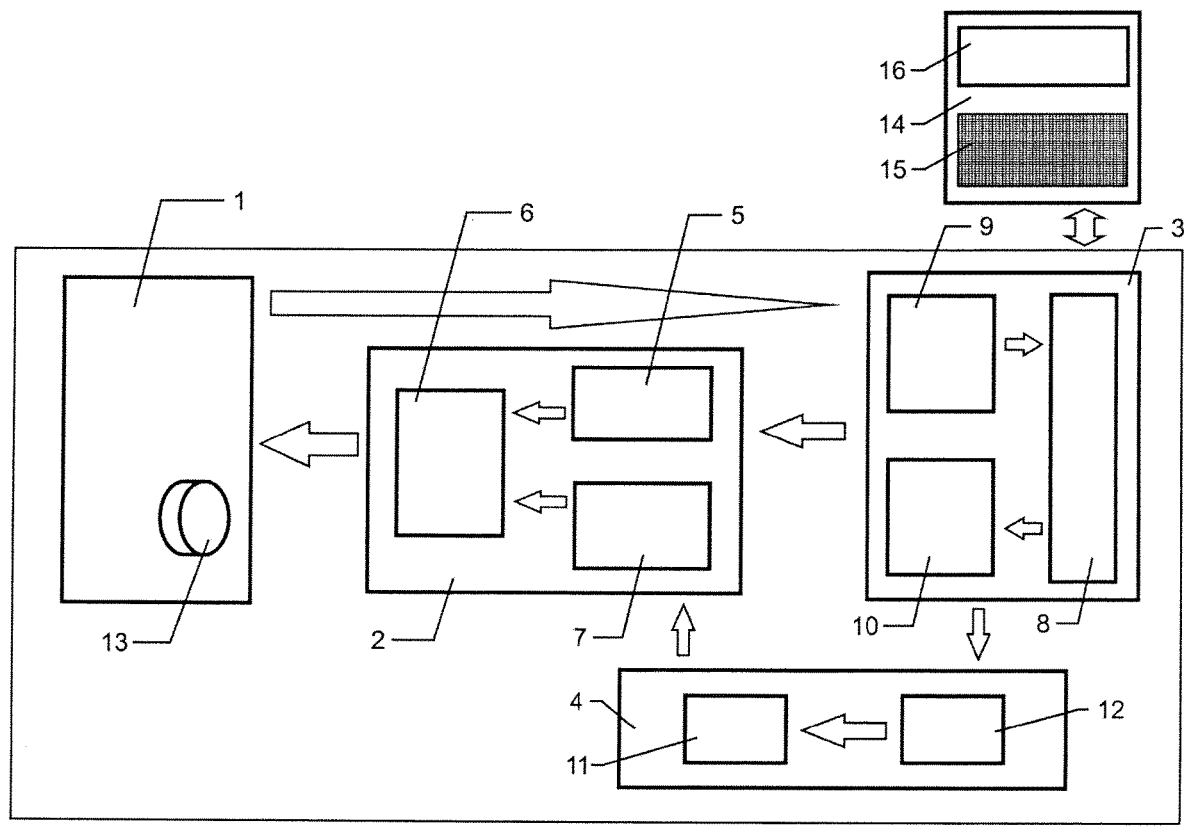

PROGRAMMABLE UNIVERSAL PROBE

RELATED APPLICATIONS

This application is a Continuation application of International Application PCT/RU2019/000716, filed on Oct. 8, 2019, which in turn claims priority to Russian Patent Application RU2018137733, filed Oct. 26, 2018, both of which are incorporated herein by reference in their entirety.

FIELD OF THE INVENTION

The invention relates to locating equipment used in the construction of wells using the trenchless technology, and is used in locating systems for horizontal directional drilling.

BACKGROUND OF THE INVENTION

It is known that the capabilities of an electronic probe placed in the drill head, in terms of the distance (depth) of stable signal transmission to the receiving device, are limited by the level of industrial electromagnetic interference at the receiving point, and that the level of spectral interference components can vary greatly from each other in different parts of the terrain. To increase the ratio of the received data signal to the level of interference for specific drilling conditions, electronic probes are used that are most suitable for the operating frequency at which the level of industrial noise at the drilling point is minimal.

Known electronic probe type FX/FXL for locating system F2 manufactured by DCI USA, consisting of a controllable electrical power source unit in a metal case and connected to the latter plastic case, which houses a controller which includes a system of accelerometer sensors, a microcontroller and a temperature sensor, an antenna assembly in the form of a ferrite transmitting antenna, and a radiated power meter, consisting of a current sensor with an amplifier. The antenna assembly is equipped with power switches and art input signal amplifier. In this case, the microcontroller also serves to generate an antenna excitation signal that transmits sensor signals to the surface. All of the listed elements, placed in a plastic case, are filled with a moisture-resistant compound. The plastic housing provides free propagation of the alternating magnetic field lines. The drill head has a section with longitudinal through slots for the unimpeded exit of the magnetic field lines. [http://gnb-electronics.ru/oborudovanie-gnb/sonde-digitrak-f2-f5/fxl12/publ. Oct. 6, 2018] [1]

The disadvantage of such a probe, which has only one operating frequency, is the inaccessibility of choosing the optimal frequency, which narrows its operational capabilities and reduces the efficiency of the probe due to the influence of industrial electromagnetic interference.

Known is an electronic probe containing an accelerometer sensor connected by outputs to a sensor signal processing unit based on the first microcontroller. The output of the unit is connected to the input of the unit for generating a signal of a certain frequency for exciting a magnetic antenna, made on the basis of the second microcontroller. In this case, the outputs of the sensors are connected simultaneously with the second and third inputs of the unit, the output of which is connected to the transmitting antenna through an antenna power amplifier. The probe is also equipped with a supply voltage generation unit from a built-in or external source. [RU 163669, G01V3/11, publ. Jul. 27, 2016] [3]

The disadvantage of this analogue of the probe is that the probe is not programmable: fixed parameters (frequencies) are initially built into the analogue, which the user can select before starting work. To do this, remove the probe from the drill head and adjust to the required operating frequency parameters. Therefore, this analogue is limited for the user by the manufacturer.

The closest in technical essence and the achieved effect is the probe of the American company Digital Control Inc. Falcon F5 systems. It is installed directly into the drill head as close as possible to the working tool and is designed to measure and transmit information about the position of the drilling tool underground (tilt, turn), its temperature, and the residual capacity of power supply elements to the operator's receiver by radio channel. Before installing the probe into the drill head, the operating frequency of its radio channel is programmed via the infrared channel [http://archive.digital-control.com/russian/products/classic/f5/f5-overview publ. Jan. 6, 2018] [2]

The disadvantage of this analogue of the probe is that in the known solution there is no possibility of tuning the probe according to the operating frequency without removing it from the drill head, since the probe has fixed operating frequencies, to change which it is necessary to remove it from the drill head. There is no possibility of changing such parameters as the radiation power of the probe, the "sleep" mode (turning off the power supply and, if necessary, resuming) In addition, when installed in drill heads with longitudinal slots geometry that does not correspond to the manufacturer's recommended ones (a number of heads for working in rocks, heavy soils), there is a large energy consumption from the battery, which significantly reduces the operating time of the probe from one power supply set. The programming of the probe is carried out via the infrared channel, and this does not allow, for example, changing the operating frequencies of transmission over the radio channel to the operator's receiver of information about the position of the drilling tool underground when the probe is installed in the drill head.

SUMMARY OF THE INVENTION

The technical problems of the proposed solution are the expansion of the user's ability to change the parameters of the probe in order to optimize them for a specific project, the creation of a probe for the drill head that provides the above parameters, the elimination of the disadvantages of analogs.

The technical results of the claimed invention are to increase the reliability and efficiency of the drill head work, provide the ability to program the power of the probe (program control of changing the transmitter power of the probe), provide the ability to program the mode of falling asleep/not falling asleep of the probe (program control of the power supply mode of the probe), providing the ability to change the operating frequency of interaction the probe and receiver to any other during drilling without removing the probe from the drilling head, providing an adaptation mode to the drill head (how well it transmits the radio signal), providing the ability to determine the control system that programs the probe.

The indicated technical results are achieved by the fact that in a programmable universal probe comprises a housing having a controllable electrical power source installed therein to provide the assemblies of the probe with a supply voltage, a controller which includes a system of accelerometer sensors, a microcontroller and a temperature sensor, an antenna assembly in the form of a ferrite transmitting antenna, and a radiated power muter, consisting of a current sensor with an amplifier. The antenna assembly is equipped with power switches and an input signal amplifier. The ferrite antenna is designed as a transceiver antenna which is capable of receiving the operating parameters of the probe in a programming mode and transmitting information to a receiver in an operating mode. The receiver and the programmable probe have a compatible data reception and transmission protocol.

Expanding the user's ability to change the probe parameters in order to optimize them for a specific project is carried out due to the possibility of programming the probe parameters, such as programming the probe power (programmed control of changing the transmitter power of the probe), programming the sleep/non-sleep mode of the probe (software control of the probe power supply mode), the ability to change the operating frequency of the interaction between the probe and the operator's receiver to any other during drilling without removing the probe from the drilling head, the presence of an adaptation mode to the drill head (how well it transmits the radio signal), determination of the control system that programs the probe. Ability is ensured due to the fact that in the menu of the receiver, which has a compatible protocol for receiving and transmitting data of the SENSE system, the value of the parameters and operating modes of the probe is set: the radiation power level, the sleep mode, the operating frequency, the permission to switch frequencies during drilling. To carry out programming at the command of the operator to complete the setting of parameters, the receiver generates a code message, in which each of the parameters has its own strictly defined place. Information about the model of the programming receiver is automatically added to the code. The code message is transmitted by the receiver, continuously repeating in the form of modulated low-frequency electromagnetic radiation. After turning on the programmable universal probe, it goes to receive mode for 10 seconds and "waits" for a code message from the receiver. In case of its absence, or inappropriate format, the probe switches to the transmission mode after 10 seconds in accordance with the previously programmed parameters. In the case of receiving a code message from a receiver of the corresponding format by the antenna unit of the probe, the parameters encoded in it are stored in the microcontroller memory of the probe, and the probe proceeds to work in accordance with the newly obtained parameters.

Programming the power of the probe is carried out by transmitting a code message from the receiver in the form of a low-frequency electromagnetic signal, which is then received by the antenna unit, and decoding and recognition of the code message by the microcontroller of the probe takes place. In accordance with the specified level of radiation power, the microcontroller sets the maximum allowable input power of the controllable electrical power source. For this, the current consumption is measured and the value of the voltage supplying it is changed so that the power supplied from the controllable electrical power source is constant. The measurement of the current consumption of the probe is carried out by a current sensor with an amplifier, the output of which is connected to the microcontroller, the output voltage is also controlled and the power consumption is calculated by the microcontroller. The operation of the probe at different powers allows to avoid overloads, to ensure the normal operation of the probe when using drill heads with not optimal slot geometry (other probes are automatically switched off) and to obtain the most effective signal when using heads with the correct slot design, that is, to "adapt" the probe to parameters of the drilling tool.

The probe sleep mode is provided by a microcontroller and a controller that includes a system of accelerometric sensors. The probe "falls asleep" provided it is motionless for a given time. The specified time is received when programming the probe, if it is equal to zero, the probe does not fall asleep. The immobility of the probe is determined by the unchanging data of its system of accelerometric sensors, which provide information to the microcontroller. The microcontroller calculates the stationary time of the probe and puts it into "sleep mode"—after a time that can also be preset during programming from the receiver. In this mode, the microcontroller switches all elements of the probe to a low power consumption mode, and the probe itself "falls asleep". This results in significant savings in the power supply of the probe. The probe wakes up at the beginning of its movement or rotation: the system of accelerometer sensors in this case generates a wake-up signal for the microcontroller, which, in turn, gives permission to connect the power supply to the probe.

If it is necessary to change the frequency of signal transmission from the probe to the receiver (coincidence of industrial frequencies operating close to the work performed, industrial equipment that interferes with the probe and causes incorrect operation), during the drilling process, it is possible to change the "frequency" by setting the probe to a certain position according to the "clock"»(Hour dial) at the specified time. In case of obtaining permission to change the frequency, the probe can be switched to the programming mode by fixing the position of the probe in certain positions "by the clock". To do this, the probe positions are sequentially fixed at "10 o'clock" for a period of 15-30 seconds, then at the "2 o'clock" position for a period of 15-30 seconds, then at the "7 o'clock" position for a period of 15-30 seconds, accelerometers are supplied signal to the microcontroller to enter the programming mode. The probe is then set to the clock position that corresponds to the desired frequency. (For example, when switching to a frequency of 30 kHz, you need to set the position "5 o'clock"). After that, the frequency is switched on the receiver by manual selection in the menu on the receiver indicator using the keyboard, after which it is necessary to fix the position of the probe at "9 o'clock" to confirm the switching and exit the probe from the programming mode. After returning to the receiver locating mode, the receiver starts displaying the actual information on the programmed frequency.

To prohibit changing the frequency, the code message from the Receiver—Probe contains the corresponding information, which is taken into account by the microcontroller program. In addition, the code also contains information about the model of the programming receiver, so changing the frequency is possible only to the one that is acceptable for the given model of the probe.

BRIEF DESCRIPTION OF THE DRAWINGS

The programmable universal probe is illustrated in the drawings.

The FIGURE shows a block diagram of the device.

DETAILED DESCRIPTION OF THE PREFERRED EMBODIMENTS

The programmable universal probe contains a controllable electrical power source 1 (FIGURE), a controller 2, an antenna unit 3, a radiated power meter 4. The controllable electrical power source 1 is configured to provide all units of a programmable universal probe with a supply voltage. The value of the supply voltage supplied to the antenna unit 3 is set by the controller 2 in accordance with the operating mode of the probe. Controller 2 includes a system of accelerometer sensors 5, microcontroller 6 and temperature sensor 7. Microcontroller 6 is configured to receive programming data for operating modes of a programmable universal probe, process information from accelerometer sensors 5, and control the operation of all nodes in accordance with a given mode. Antenna unit 3 consists of a ferrite transceiving antenna 8, power switches 9 and an amplifier of input signals 10. In the programming mode, the transceiving antenna 8 is a receiving antenna (it receives the operating parameters of the probe), in the operating mode it is a transmitting antenna (information is transmitted to the receiver). The radiated power meter 4 is a current sensor 11 with an amplifier 12, the latter is configured to measure the power consumption of the antenna unit 3 and be used in the adaptation mode to the drill head. The controlled electrical power source 1 contains replaceable chemical elements 13. Programming is carried out from the receiver 14 by means of the keyboard 15 and indicator 16.

The programmable universal probe works as follows. The controlled electrical power source 1 generates the supply voltage for all nodes. After power up, controller 2 puts the probe into programming mode. A code message from the receiver in the form of a low-frequency electromagnetic programming signal (in which information about the operating modes of the probe is encoded) from an external device is converted by the transceiving antenna 8 into an electrical signal, amplified by the antenna unit 3 and fed to the controller 2. After receiving data on the operating modes, the controller 2 generates the appropriate commands, and the probe goes into transmission mode. If the programming does not occur within the specified time, the probe switches to the transmission mode in accordance with the latest programming data. In the programming mode, you can program the radiation frequency of the transceiving antenna 8 (the frequency of the corresponding signals generated by the controller 2 for the antenna unit 3 changes), the radiation power, which is determined by the voltage supplied to the antenna unit 3, set by the controller 2, the "sleep" mode, i.e. .e. the time the probe was in motion until it was turned off in order to save the power of the source; data transfer protocol (the probe can be compatible with various locating systems (even from different manufacturers); enabling the adaptation mode to the drill head. The adaptation mode to the drill head in the probe is implemented by the ability to measure and maintain a constant specified power consumption by the antenna unit 3, that is, by programming the power consumption power, the possibility of ineffective energy losses can be reduced (accordingly, the detection range of the probe is reduced to the optimal value) when working with drill heads, in which the geometry of the longitudinal slots does not correspond to the manufacturer's recommendations (narrowed, shortened or displaced), and, conversely, when the dimensions of the longitudinal slots exceed recommended, the detection range of the probe is increased while maintaining power consumption.

The programmable universal probe is used as follows. In the receiver menu 14, for example, SNS systems manufactured by SENSE HDD 11c [http://sense-hdd.ru/] set the value of the parameters and operating modes of the probe: radiation power level, sleep mode, operating frequency, frequency change resolution in the process drilling. Upon the operator's command to complete the setting of the parameters, the receiver 14 generates a code message in the form of a low-frequency electromagnetic signal, in which each of the parameters has its own strictly defined place. Information about the model of the programming receiver 14 is automatically added to the code message. The code message is transmitted by the receiver 14, continuously repeating in the form of modulated low-frequency electromagnetic radiation. After installing replaceable chemical elements 13 into the probe, the probe goes into the receiving mode for 10 seconds and "waits" for a code message. In case of its absence, or inappropriate format, the probe switches to the transmission mode after 10 seconds in accordance with the previously programmed parameters. In the case of receiving a message of the corresponding format by the antenna unit 3 of the probe, the parameters encoded in it are stored in the memory of the microcontroller 6 of the probe, and the probe proceeds to work in accordance with the newly obtained parameters. The reception of a low-frequency electromagnetic signal in the probe is carried out by the antenna unit 3, the decoding and recognition of the message takes place in the microcontroller 6 of the probe. In accordance with a given level of radiation power, the microcontroller 6 sets the maximum allowable input power of the power supply. For this: the consumption current is measured and the value of the voltage supplied to it is changed by the radiated power meter 4 so that the supplied power is constant. The measurement of the current consumption of the probe is carried out by the current sensor 11 with the amplifier 12, the output of which is connected to the microcontroller 6, the output voltage is controlled and the power consumption is calculated by the microcontroller 6. Thus, the operation of the probe at different powers is realized, at the same time this allows avoiding overloads, ensuring normal operation probe when using drill heads with non-optimal slot geometry (usually other probes are automatically disabled) and get the most effective signal when using heads with the correct slot design, that is, "adapt" the probe to the parameters of the drilling tool. The sleep mode is provided by the controller 2, which includes a microcontroller 6 and a system of accelerometer sensors 5. The probe "falls asleep" provided it is motionless for a given time. The preset time is set when programming the probe: if it is zero, the probe does not sleep. The immobility of the probe is determined by the unchanging data of its system of accelerometric sensors 5, which provide information to the microcontroller 6. The microcontroller 6 calculates the time of the stationary state of the probe and puts it into a "sleep mode"—after the time set by the receiver 14. In this mode, the microcontroller 6 switches to the mode low consumption all elements of the probe and "falls asleep" itself. The probe wakes up at the beginning of its movement or rotation: the system of accelerometer sensors 5, in this case, generates a wake-up signal for the microcontroller 6. During drilling, it is possible to change the frequency by setting the probe to a certain position according to the "clock" for a specified time. In case of obtaining permission to change the frequency, the probe can be switched to the programming mode by fixing the position of the probe in certain positions "by the clock".

The process itself consists of several sequential steps. When sequentially fixing the probe position at "10 o'clock" for a period of 15-30 seconds, then at the "2 o'clock" position for a period of 15-30 seconds, then at the "7 o'clock" position for a period of 15-30 seconds, the accelerometer sensor system 5 sends a signal to the microcontroller 6 to enter the programming mode. The probe is then set to the clock position that corresponds to the desired frequency. (for example, when switching to a frequency of 30 kHz, it is necessary to set the position "5 o'clock"), after which the frequency switches on the receiver 14. Then the position of the probe is fixed at "9 o'clock" to confirm the switching and withdraw the probe from the programming mode. To prohibit changing the frequency in the code message from the receiver 14—the probe contains the corresponding information, which is taken into account by the program of the microcontroller 6, in addition, the code message also contains information about the model of the programming receiver, so changing the frequency is possible only to the one that is acceptable for this model.

When using a programmable universal probe, it becomes possible to program the frequency of the probe, program the power of the probe, program the mode of sleep/non-sleep of the probe, the ability to switch the frequency of the probe to any other during drilling, the presence of an adaptation mode to the drill head. The probe has a cylindrical shape generally accepted for navigation systems of this class, divided into two parts: plastic and metal. The part where the antenna is located is made of radio-transparent plastic, the part for the battery is metal.

What is claimed is:
1. A programmable universal probe for drill heads of horizontal directional rigs, the programmable universal probe comprising:
 a housing having a controllable electrical power source installed in the housing, the electrical power source serving to provide assemblies of the probe with a supply voltage;
 a controller comprising a system of accelerometer sensors;
 a microcontroller and a temperature sensor;
 an antenna assembly comprising a ferrite transmitting antenna; and
 a radiated power meter comprising a current sensor with an amplifier;
 wherein the antenna assembly is equipped with power switches and with an input signal amplifier, wherein the ferrite antenna is designed as a transceiver antenna capable of receiving operating parameters of the probe in a programming mode and transmitting information to a receiver in an operating mode, and wherein the receiver and the programmable probe have a compatible data reception and data transmission protocol.

* * * * *